United States Patent
Lee et al.

(10) Patent No.: US 7,283,361 B2
(45) Date of Patent: Oct. 16, 2007

(54) HEAT DISSIPATION DEVICE

(75) Inventors: Hsieh-Kun Lee, Tu-Cheng (TW); Wan-Lin Xia, Shenzhen (CN); Bao-Chun Chen, Shenzhen (CN)

(73) Assignees: Fu Zhun Precision industry (Shenzhen) Co., Ltd., Shenzhen, Quangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 186 days.

(21) Appl. No.: 11/166,984

(22) Filed: Jun. 24, 2005

(65) Prior Publication Data
US 2006/0291169 A1 Dec. 28, 2006

(51) Int. Cl.
*H05K 7/20* (2006.01)
*H01L 23/34* (2006.01)
*A44B 21/00* (2006.01)

(52) U.S. Cl. .................. 361/704; 257/719; 24/458; 24/513

(58) Field of Classification Search ................ 361/688, 361/689, 701–704, 709, 711, 728, 747; 257/706, 257/707, 722; 165/80.2, 80.3; 439/485, 439/487
See application file for complete search history.

(56) References Cited

U.S. PATENT DOCUMENTS

| 6,449,154 | B1 | 9/2002 | Yoneyama et al. | |
| 6,473,306 | B2* | 10/2002 | Koseki et al. | 361/704 |
| 6,894,898 | B2* | 5/2005 | Liu | 361/697 |
| 6,934,153 | B2* | 8/2005 | Lee et al. | 361/697 |
| 2005/0111191 | A1* | 5/2005 | Lee et al. | 361/704 |
| 2005/0199370 | A1* | 9/2005 | Huang | 165/80.3 |
| 2005/0281001 | A1* | 12/2005 | Dittus et al. | 361/710 |
| 2006/0203452 | A1* | 9/2006 | Barina et al. | 361/701 |

FOREIGN PATENT DOCUMENTS

TW     M249436     11/2004

* cited by examiner

*Primary Examiner*—Lisa Lea-Edmonds
*Assistant Examiner*—Anthony M Haughton
(74) *Attorney, Agent, or Firm*—Morris Manning Martin LLP; Tim Tingkang Xia, Esq.

(57) ABSTRACT

A heat dissipation device includes a heat sink, a retention module and a clip having two clipping portions for securing the heat sink to the retention module. The heat sink includes a base for contacting with a heat generating electronic device. The base defines two flutes in two opposite sides thereof respectively. Each of the flutes is located at a middle of a corresponding one of the two opposite sides. The retention module is located around the electronic device and includes a bottom wall for supporting the heat sink. Each clipping portion is rotatably connected to the retention module and includes a pressing portion which is rotatably received in the flute of the base and presses the base to the bottom wall of the retention module when the clip is rotated to a position locked to the retention module.

19 Claims, 5 Drawing Sheets

HEAT DISSIPATION DEVICE

BACKGROUND

1. Field

The present invention relates generally to heat dissipation devices, and more particularly to a heat dissipation device used for electronic devices.

2. Prior Art

As computer technology continues advancing, electronic devices of computers are made to provide faster operational speed and greater functional capabilities. When an electronic device operates at a high speed, heat generated by it increases greatly and dramatically, which can make the electronic device operate unstably. So, it is desirable to dissipate the generated heat duly, for example, by using a heat dissipation device such as a heat sink attached to the electronic device.

In order to keep the heat sink intimately contacting the electronic device, a retaining device is usually used for securing the heat sink to the electronic device.

Nowadays, numerous heat dissipation devices are used for dissipating heat generated by electronic devices. Typically, a heat dissipation device comprises a heat sink, a retention module and a piece of elongated clip is often used. The clip comprises a central pressing portion and a pair of engaging portions extending perpendicularly from the pressing portion. The retention module forms corresponding engaging members thereof for engaging with the engaging portions of the clip. In assembly, the pressing portion rests on the heat sink and presses the heat sink toward the electronic device. The engaging portions of the clip are engaged with the engaging members of the retention module. Thus, the heat sink is secured to the electronic device. Unfortunately, tools are required to have the engaging portions engaged/disengaged with/from the engaging members of the retention module. Additionally, engagement or disengagement of the clip with or from the retention module is still unduly laborious. Therefore, it is inconvenient to secured heat sink to the electronic device.

SUMMARY

Accordingly, what is needed is a heat dissipation device of which a heat sink can be secured to a retention module and a heat generating electronic device expediently.

A heat dissipation device of a preferred embodiment comprises a heat sink, a retention module and a clip having two clipping portions for securing the heat sink to the retention module. The heat sink comprises a base for contacting with a heat generating electronic device. The base defines two flutes in two opposite sides thereof respectively. The flutes are located at middles of the opposite sides, respectively. The retention module is located around the electronic device and comprises a bottom wall for supporting the heat sink. Each clipping portion is rotatably connected to the retention module and comprises a pressing portion which is rotatably received in the flute of the base. By rotating the clip to a position where the clip is fastened to the retention module, the pressing portion presses the base to the bottom wall of the retention module, thereby enabling the heat sink to have an intimate contact with the electronic device. Thus, the heat sink can be secured to the retention module and the electronic device expediently.

Other advantages and novel features of the invention will become more apparent from the following detailed description when taken in conjunction with the accompanying drawings, in which:

DETAILED DESCRIPTION OF THE EMBODIMENT

Figure 1:
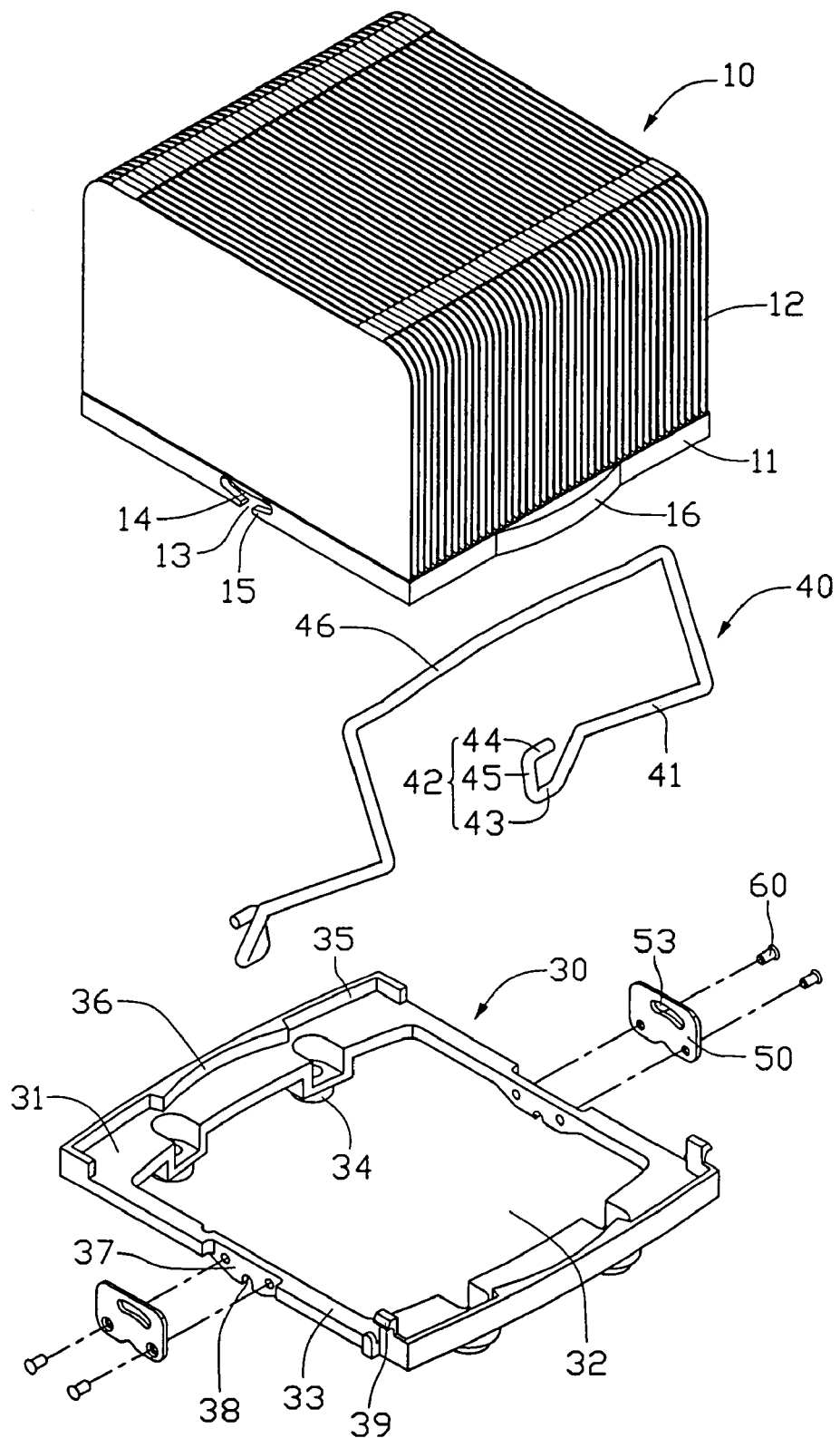
FIG. 1 is an exploded view of a heat dissipation device according to a preferred embodiment of the present invention.
Figure 2:
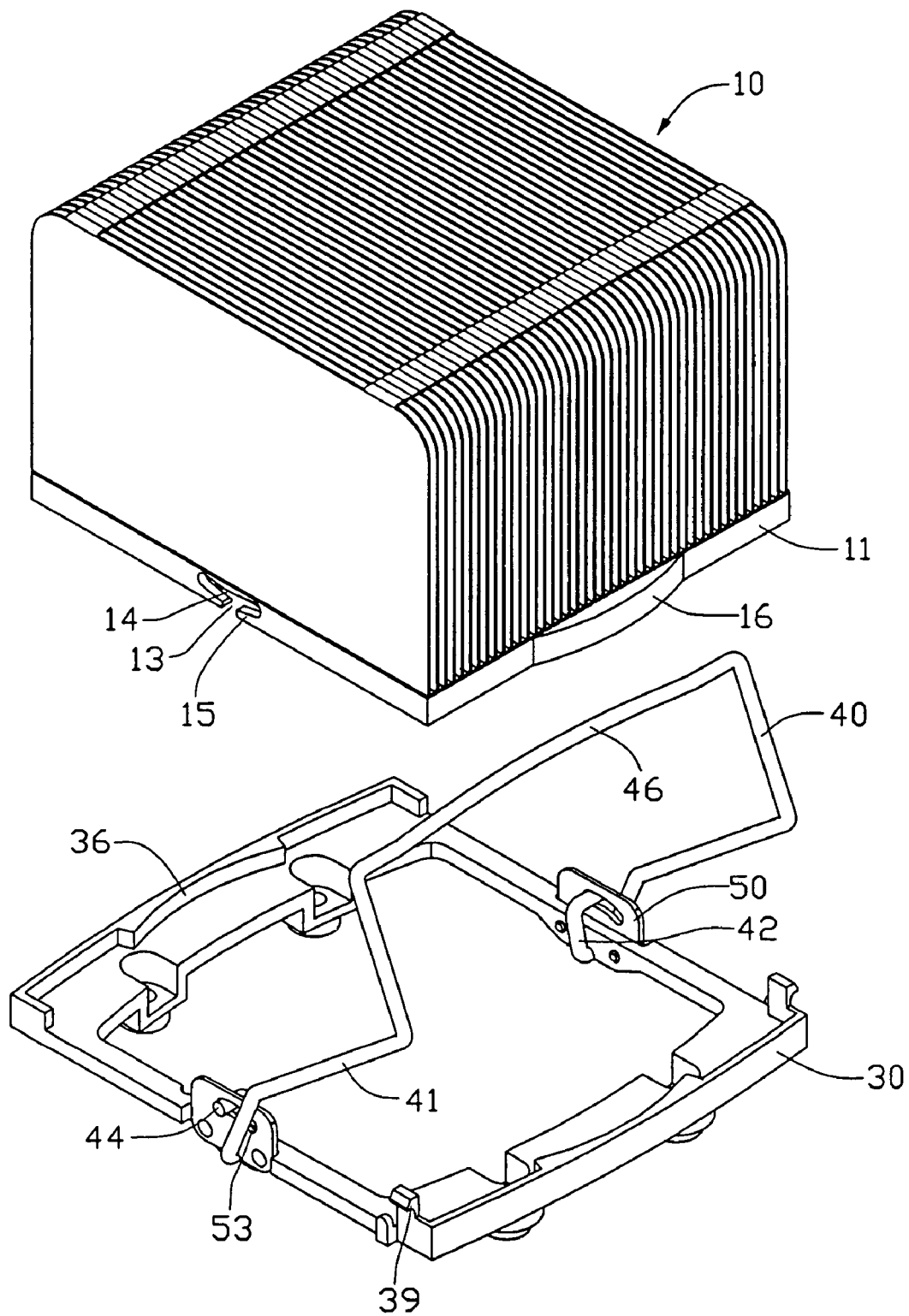
FIG. 2 is a partial assembled view of FIG. 1 with a clip assembled with a retention module of the heat dissipation device.
Figure 3:
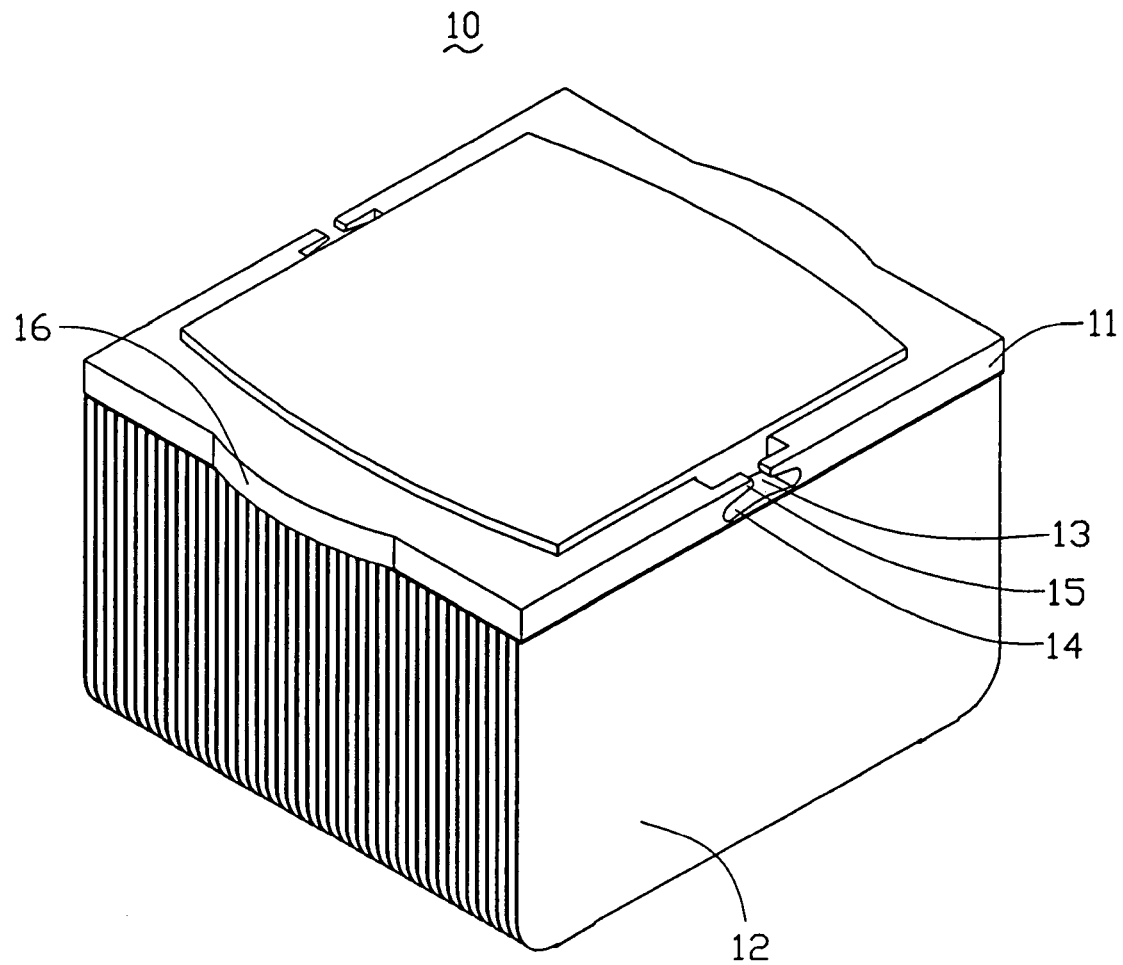
FIG. 3 is a heat sink of FIG. 1 in an inverted aspect to show a detail of a bottom thereof.

Referring to FIGS. 1-3, the heat dissipation device comprises a heat sink 10, a retention module 30 and a clip 40 for securing the heat sink 10 to a heat generating electronic device (not shown) located on a printed circuit board (not shown) and surrounded by the retention module 30.

The heat sink 10 comprises a base 11 for contacting the electronic device with a bottom surface thereof and a plurality of fins 12 arranged on an upper surface of the base 11. The base 11 defines two arc-shaped laterally-extending flutes 14 each in a center of one of two opposite sides thereof. Each flute 14 has two lateral ends tilting upwardly, and a cutout 13 defined at a center of a bottom thereof for the clip 40 to pass through into the flute 14. At the bottom of the flute 14, the base 11 at two sides of the cutout 13 forms two blocks 15 respectively. Each block 15 has an upper surface slanting upwardly toward a corresponding lateral end of the flute 14. The base 11 further extends two protrusions 16 respectively from another two opposite sides thereof.

The retention module 30 is a substantially rectangular frame. The retention module 30 comprises a bottom wall 31 with an opening 32 defined in a center thereof. Two opposite spaced beams 33 are formed at two opposite sides of the opening 32. Four feet 34 substantially depend from the bottom wall 31 at four corners thereof, for securing the retention module 30 to the printed circuit board. Two sidewalls 35 respectively extend upwardly from two outmost sides of the bottom wall 31. A baffle 36 is substantially formed at middle part of each sidewall 35. The baffle 36 has an arced inner face corresponding to the protrusion 16. Each beam 33 at a center of an outer side thereof is concave and forms a fixing portion 37. The fixing portion 37 defines a notch 38 at a bottom thereof for receiving the clip 40 therein. A guiding member 50 is fixed to the fixing portion 37 via two pins 60 extending through the guiding member 50 and engaging in two fixing holes (not labeled) defined beside the notch 38 in the fixing portion 37. The guiding member 50 defines an arc guiding slot 53 therein which is located above the beam 33 for the clip 40 to slide therein after the clip 40, the retention module 30 and the guiding member 50 are assembled together. The slot 53 is substantially arc-shaped having two lateral ends pointing downwardly wherein one end is lower than the other. One of the two sidewalls 35 at two ends thereof respectively forms two ears 39 each of which has an outwardly projection (not labeled) for locking with the clip 40 to the retention module 30.

The clip 40 is formed by folding a metal wire. The clip 40 comprises two clipping portions (not labeled) connected by an operating beam 46. Each clipping portion consists of a clamping beams 41 and a retaining portion 42. The clamping beam 41 is used for fastening the clip 40 to the retention module 30. The retaining portion 42 is formed at a distal end of the clamping beam 41. The retaining portion 42 comprises an abutting portion 43 and a pressing portion 44 substantially parallel to the abutting portion 43, for pressing the base 11 of the heat silk 10 toward the retention module 30, and a connecting portion 45 connecting the abutting portion 43 and the pressing portion 44. In assembly, the abutting portion 43 is brought to engage in the notch 38 of the retention module 30. A distal end of the pressing portion 44 is received in the slot 53 of the guiding member 50, and the distal end can move along the slot 53 around the abutting portion 43 by rotating the clip 40. The operating beam 46 connects the clamping beams 41.

Figure 4:
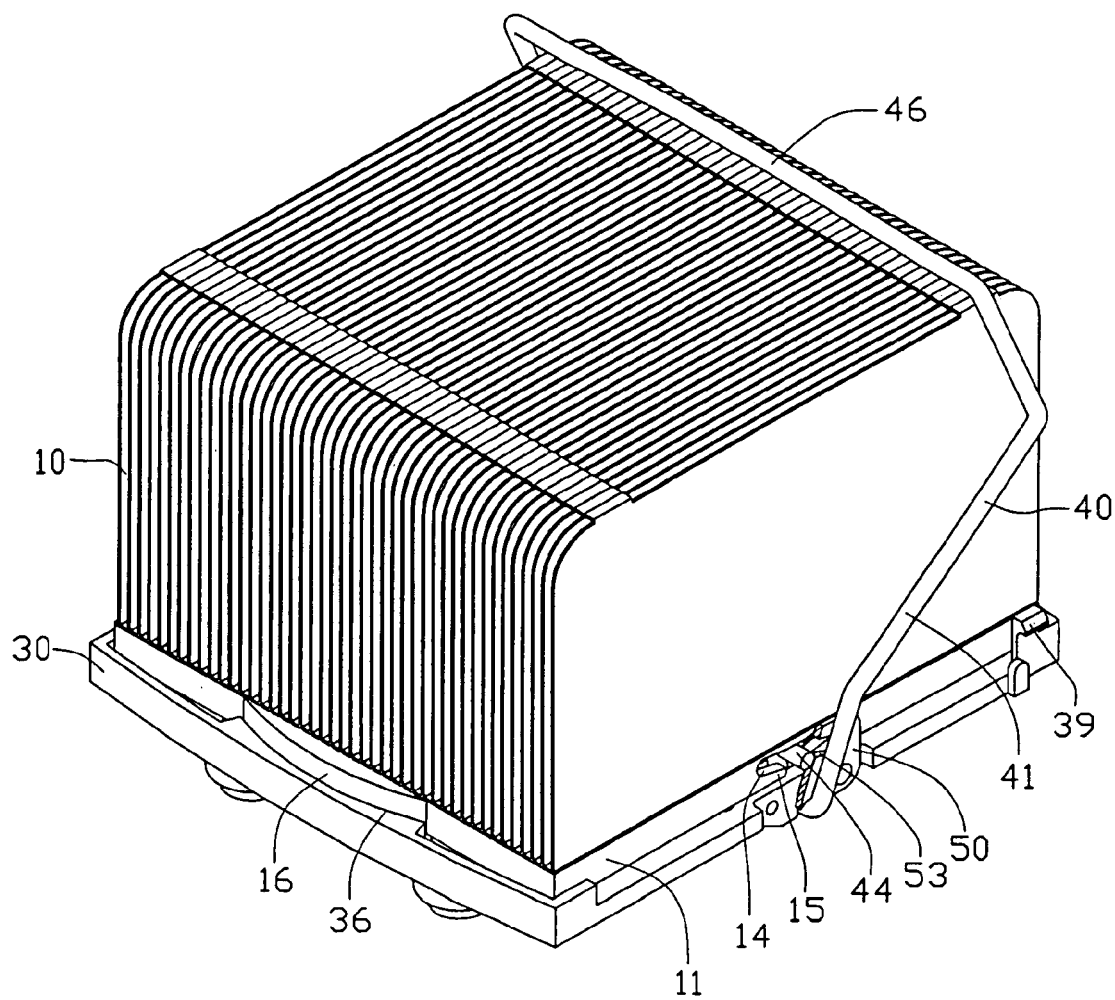
FIG. 4 is an assembled, partially cut-away view of FIG. 1 in which the clip is positioned at an unlocked position.
Figure 5:
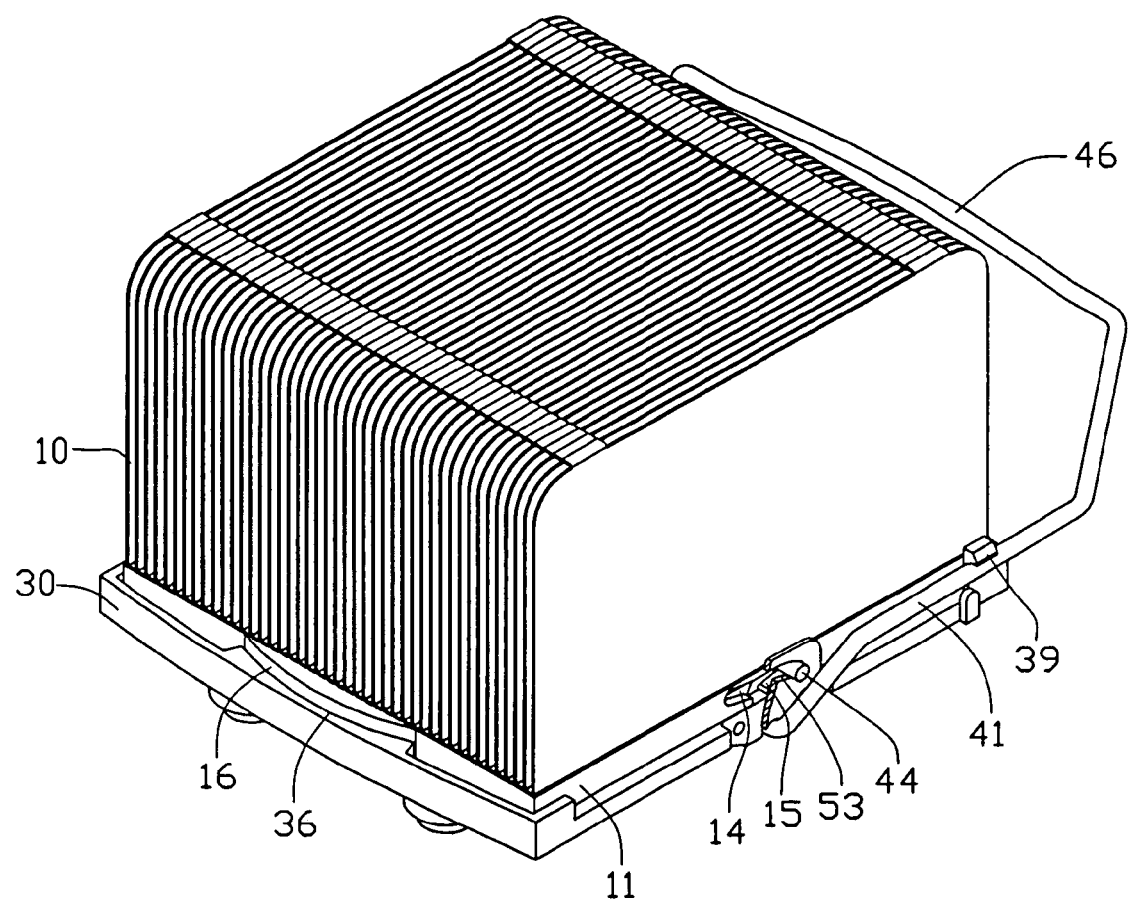
FIG. 5 a view similar to FIG. 4 wherein the clip is moved to a locked position.

Referring to FIGS. 4-5, in assembling the heat sink 10 to the electronic device, the heat sink 10 is positioned on the bottom wall 31 of the retention module 30 with the protrusions 16 of the base 11 engaging the arced inner faces of the two baffles 36 of the two sidewalls 35 of the retention module 30. The pressing portion 44 of the clip 40 is received in the flute 14 by moving through the cutout 13, and abuts against the heat sink 10 at the center of the flute 14 (particularly see FIG. 4). Here, the upper end of the slot 53 of the guiding member 50 is substantially corresponding to the center of the flute 14 and the lower end of the slot 53 is located below a corresponding lateral end of the flute 14. Rotating the operating beam 46, the pressing portion 44 slides in the slot 53 from the higher end toward the lower end thereof. Meanwhile, the pressing portion 44 also moves in the flute 14 from the center toward the corresponding lateral end and presses a corresponding block 15 downwardly. The heat sink 10 is thus pressed toward the bottom wall 31 of the retention module 30 and the heat generating electronic device surrounded by the retention module 30. The operating beam 46 is rotated till the clamping beam 41 is engaged with the ear 39 of the retention module 30 in which the pressing portion 44 is located at the upper end of the slot 53 and the corresponding lateral end of the flute 14 (particularly see FIG. 5). Here, the pressing portion 44 presses the base 11 of the heat sink 10 to have a close contact with the bottom wall 31 of the retention module 30, and therefore the heat sink 10 has an intimate engagement with the heat generating electronic device.

According to the preferred embodiment of the invention, the clip 40 is rotatably connected to the retention module 30, and the pressing portion 44 of the clip 40 can move in the flute 14 of the base 11. Therefore, the pressing portion 44 presses one of the blocks 15 of the base 11 downwardly when the clip 40 is rotated by rotating the operating beam 46. And, when the clamping beam 41 is fastened to the ear 39 of the retention module 30, the pressing portion 44 presses the base 11 to intimately contact the electronic device. So, it is easy and laborsaving to perform the fastening of the heat sink 10 to the heat generating electronic device in accordance with the present invention. Furthermore, since the clip 40 downwardly presses the heat sink 10 at a middle of the heat sink 10, the downwardly clamping force can be more directly and evenly applied to the heat generating electronic device which is generally located at a center of the heat sink 10, whereby the degree of intimacy of the contact between the heat sink 10 and the electronic device can be improved and therefore heat flux from the electronic device to the heat sink 10 can be enhanced.

To remove the heat sink 10 from the electronic device, the clamping beams 41 of the clip 40 are disengaged from the ears 39 of the retention module 30, and then the operating beam 46 is rotated reversely to reach its original position as shown in FIG. 4. The pressing portions 44 of the clip 40 are released from pressing the blocks 15 of the base 11 to abut against the heat sink 10 at the center of the flutes 14 and prop the heat sink 10 upwardly. Thus, the heat sink 10 can be removed from the electronic device and the retention module 30.

It can be understood that the operating beam 46 connecting the two clipping portions of the clip 40 can be omitted. The clamping beam 41 can be operated independently to manipulate the pressing portion 44 to achieve the engagement and disengagement between the heat sink 10 and the heat generating electronic device.

It is to be understood, however, that even though numerous characteristics and advantages of the present invention have been set forth in the foregoing description, together with details of the structure and function of the embodiment, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A heat dissipation device comprising:
   a heat sink comprising a base for contacting a heat generating device, the base defining two flutes in two opposite sides thereof respectively;
   a retention module for being located around the heat generating device, the retention module comprising a bottom wall supporting the heat sink; and
   two clipping portions, each of which is rotatably connected to the retention module, for securing the heat sink to the retention module, each of the two clipping portions comprising a pressing portion which is rotatably received in the flute of the base of heat sink and presses the base to the bottom wall of the retention module when the each clipping portion is fastened to the retention module;
   wherein the flute is arc-shaped with two lateral ends being higher than a center of the flute, the pressing portion moves from the center to one of the lateral ends when the each clipping portion is rotated to be fastened to the retention module.

2. The heat dissipation device of claim 1, wherein each of the two flutes comprises a cutout defined at a center of a bottom thereof for the pressing portion of the each clipping portion to pass through into the flute, and the base at two sides of the cutout forms two blocks, the pressing portion of the each clipping portion pressing downwardly one of the two blocks.

3. The heat dissipation device of claim 1, wherein the retention module is a substantially rectangular frame with an opening defined in a center thereof, and two spaced beams are formed at two opposite sides of the opening, the two clipping portions are rotatably connected to the two beams respectively.

4. The heat dissipation device of claim 3, wherein each of the two beams at a center thereof defines a notch in a bottom edge thereof, and each of the two clipping portions comprises an abutting portion rotatably engaged in the notch, and wherein the pressing portion and the abutting portion are connected by a connecting portion.

5. The heat dissipation device of claim 4, wherein each of the beams at a center of an outer side thereof is concave where a guiding member is fixed above the notch, and the guiding member defines an arc guiding slot above the beam, and wherein the pressing portion of the each clipping portion is slidablely received in the slot.

6. The heat dissipation device of claim 3, wherein the retention module has two opposite sidewalls extending upwardly from the bottom wall.

7. The heat dissipation device of claim 6, wherein the base forms two protrusions at another two opposite sides thereof, and each of the two sidewalls at a center thereof extends a baffle having an arced inner face facing the opening, the protrusions engaging the arced inner faces.

8. The heat dissipation device of claim 6, wherein each of the two clipping portions comprises a clamping beam connecting the abutting portion, and one of the two sidewalls at two ends thereof respectively form two ears, the ears locking the clamping beams to the retention module.

9. The heat dissipation device of claim 8, wherein the two clipping portions are connected by an operating beam connecting the clamping beams of the two clipping portions.

10. A heat dissipation device adapted for a heat generating device, comprising:
a heat sink comprising a base defining two flutes in two opposite sides thereof respectively;
a retention module for being located around the heat generating device, the retention module comprising a bottom wall with two spaced beams formed at two opposite sides thereof, each of the two beams defining a notch at a bottom edge thereof; and
two clipping portions connected to two sides of the retention module, each clipping portion comprising an abutting portion rotatablely engaged in the notch, and a pressing portion being rotatablely received in the flute of the base of the heat sink and pressing the heat sink to the bottom wall of the retention module when the clipping portions are fastened to the retention module;
wherein the flute is arc-shaped with two lateral ends being higher than a center of the flute, and the pressing portion moves from the center to one of the lateral ends when the clipping portions are rotated to be fastened to the retention module.

11. The heat dissipation device of claim 10, wherein each of the two flutes comprises a cutout defined at a center of a bottom thereof for the pressing portion of the each clipping portion to pass through into the flute, and wherein the base at two sides of the cutout forms two blocks, the pressing portion of the each clipping portion pressing downwardly one of the two blocks.

12. The heat dissipation device of claim 10, wherein each of the beams at a center of an outer side thereof is concave where a guiding member is fixed above the notch, and the guiding member defines an arc guiding slot above the beam, and wherein the pressing portion of the each clipping portion is slidablely received in the slot.

13. The heat dissipation device of claim 10, wherein the base forms two protrusions at another two opposite sides thereof, and the retention module has two opposite sidewalls extending upwardly from the bottom wall, and each of the two sidewalls at a center thereof extends a baffle having an arced inner face facing the protrusion, the protrusions engaging the arced inner faces.

14. The heat dissipation device of claim 13, wherein each of the two clipping portions comprises a clamping beam connecting the abutting portion, and one of the two sidewalls at two ends thereof respectively form two ears, the ears locking the clamping beams to the retention module.

15. The heat dissipation device of claim 14, wherein the two clipping portions are connected by an operating beam connecting the clamping beams of the two clipping portions.

16. The heat dissipation device of claim 10, wherein each of two clipping portions has a connecting portion connecting the pressing portion and the abutting portion.

17. A heat dissipation device for a heat generating electronic device, comprising:
a heat sink having a bottom face for contacting with the heat dissipation device, a flute located substantially at a middle of a side of the heat sink, and a plurality of fins extending upwardly;
a retention module on which the heat sink is mounted, having an opening for receiving the heat generating electronic device and a slot located corresponding to the flute; and
a clip having a pressing portion extending in the flute and the slot, a rotation of the clip causing the pressing portion to move from a first position to a second position, at the second position the pressing portion downwardly pressing the heat sink toward the retention module;
wherein the flute is arc-shaped with two lateral ends being higher than a center of the flute, the pressing portion moves from the center to one of the lateral ends when the pressing portion moves from the first position to the second position.

18. The heat dissipation device of claim 17, wherein the slot is arc-shaped with a high end and a low end and the pressing portion moves from the high end to the low end when the pressing portion moves from the first position to the second position.

19. The heat dissipation device of claim 18, wherein when the pressing portion is at the first position, the low end of the slot is located below the one of the lateral ends of the flute.

* * * * *